(12) United States Patent
Ding et al.

(10) Patent No.: US 9,756,762 B2
(45) Date of Patent: Sep. 5, 2017

(54) CIRCULATIVE COOLING SYSTEM AND METHOD FOR CONTROLLING CIRCULATION IN THE COOLING SYSTEM

(75) Inventors: Yigong Ding, Beijing (CN); Weizheng Yao, Xuchang (CN); Jian Zhang, Xuchang (CN); Weihua Ruan, Xuchang (CN); Dawei Wang, Xuchang (CN)

(73) Assignees: State Grid Corporation of China, Beijing (CN); Xuchang Xuji Jing Rui Science & Technology Co., Ltd., Xuchang, Henan (CN)

( * ) Notice: Subject to any disclaimer, the term of this patent is extended or adjusted under 35 U.S.C. 154(b) by 616 days.

(21) Appl. No.: 14/361,834

(22) PCT Filed: May 29, 2012

(86) PCT No.: PCT/CN2012/076186
§ 371 (c)(1),
(2), (4) Date: Oct. 23, 2014

(87) PCT Pub. No.: WO2013/078842
PCT Pub. Date: Jun. 6, 2013

(65) Prior Publication Data
US 2015/0068722 A1 Mar. 12, 2015

(30) Foreign Application Priority Data
Dec. 1, 2011 (CN) .......................... 2011 1 0391510

(51) Int. Cl.
*F28F 13/00* (2006.01)
*H05K 7/20* (2006.01)

(52) U.S. Cl.
CPC ..... *H05K 7/20281* (2013.01); *H05K 7/20927* (2013.01); *H05K 7/20945* (2013.01)

(58) Field of Classification Search
CPC .............. H05K 7/20; F25D 1/02; F25D 17/00
See application file for complete search history.

(56) References Cited

U.S. PATENT DOCUMENTS 5,513,500 A * 5/1996 Fischer .............. B64D 11/0007
62/239
7,334,422 B2 * 2/2008 Zywiak .................. B64D 13/06
62/401
(Continued)

FOREIGN PATENT DOCUMENTS

CN 2294433 Y 10/1998
CN 2561099 Y 7/2003
(Continued)

OTHER PUBLICATIONS

International Search Report Corresponding to International Application No. PCT/CN2012/076186; dated Sep. 6, 2012; 6 Pages.
(Continued)

*Primary Examiner* — Ljiljana Ciric
(74) *Attorney, Agent, or Firm* — Myers Bigel, P.A.

(57) ABSTRACT

A circulative cooling system and a method for controlling the circulative cooling system are disclosed. The circulative cooling system is divided into three parts: an internal cooling circulation device, a plate heat exchanger and an external cooling circulation device. The internal cooling circulation device is adapted to perform circulation cooling on a heat-generating device; the plate heat exchanger is adapted to perform heat exchange between external cooling water in the external cooling circulation device and the internal cooling water in the internal cooling circulation device. The external cooling circulation device is adapted to cool the external cooling water. The external cooling primary circulation pump, the cold accumulation water pool, the water-air plate-wing heat exchanger, the cold accumu-
(Continued)

lation air cooler, and the first valve and the second valve may be controlled.

26 Claims, 8 Drawing Sheets

(56) References Cited

U.S. PATENT DOCUMENTS

| | | | | |
|---|---|---|---|---|
| 9,266,601 | B2* | 2/2016 | Klimpel | B64C 1/18 |
| 2004/0040326 | A1* | 3/2004 | Hunt | F25B 9/004 |
| | | | | 62/236 |
| 2007/0095521 | A1* | 5/2007 | Muhlthaler | B64D 11/04 |
| | | | | 165/274 |
| 2008/0047688 | A1* | 2/2008 | Ebigt | F28D 7/0025 |
| | | | | 165/80.2 |
| 2008/0055852 | A1* | 3/2008 | Uluc | H05K 7/20218 |
| | | | | 361/696 |
| 2010/0071881 | A1 | 3/2010 | Murer et al. | |
| 2015/0237766 | A1* | 8/2015 | Ding | H05K 7/20254 |
| | | | | 62/79 |

FOREIGN PATENT DOCUMENTS

| | | |
|---|---|---|
| CN | 1632430 A | 6/2005 |
| CN | 1891994 A | 1/2007 |
| CN | 201043863 Y | 4/2008 |
| CN | 201053795 Y | 4/2008 |
| CN | 101473709 A | 7/2009 |
| CN | 201352745 Y | 11/2009 |
| CN | 101694357 A | 4/2010 |
| CN | 201491453 U | 5/2010 |
| CN | 201774788 U | 3/2011 |
| CN | 201852343 U | 6/2011 |
| CN | 201878485 U | 6/2011 |
| CN | 102368615 A | 3/2012 |
| CN | 102435032 A | 5/2012 |
| CN | 102435033 A | 5/2012 |
| CN | 202403477 U | 8/2012 |
| JP | S54146444 A | 11/1979 |
| JP | S59119750 A | 7/1984 |
| JP | S6373879 A | 4/1988 |
| JP | H05136587 A | 6/1993 |
| JP | H07218075 A | 8/1995 |
| JP | 2001010595 A | 1/2001 |

OTHER PUBLICATIONS

International Search Report Corresponding to International Application No. PCT/CN2012/076187; dated Sep. 6, 2012; 8 Pages.
International Search Report Corresponding to International Application No. PCT/CN2012/076189; dated Sep. 27, 2012; 8 Pages.
Decision to Grant, Chinese Patent Application No. 201110393314.9, dated Feb. 27, 2014, 2 pages.
Chinese Office Action Corresponding to Chinese Patent Application No. 201110393314.9; dated Aug. 19, 2013; Foreign Text, 8 Pages.
Chinese Office Action Corresponding to Chinese Patent Application No. 201110393314.9; dated Dec. 31, 2012; Foreign Text, 6 Pages.

* cited by examiner

US 9,756,762 B2

CIRCULATIVE COOLING SYSTEM AND METHOD FOR CONTROLLING CIRCULATION IN THE COOLING SYSTEM

RELATED APPLICATIONS

The present application is a 35 U.S.C. §371 national phase application of PCT International Application No. PCT/CN2012/076186, filed May 29, 2012, which claims priority from Chinese Patent Application No. 201110391510.2, filed Dec. 1, 2011, the disclosures of which are hereby incorporated herein by reference in their entireties. PCT International Application No. PCT/CN2012/076186 is published as PCT Publication No. WO 2013/078842 A1.

TECHNICAL FIELD

The present disclosure relates to the cooling field, and more particularly to a circulative cooling system and a method for controlling the circulative cooling system.

DESCRIPTION OF THE RELATED ART

Currently, it is common for primary cooling apparatus utilized in power generation and power transmission facilities to adopt closed circulative cooling systems. In order to guarantee that the temperature of heat-generating equipment is kept in a range acceptable to materials or technological requirements thereof; there is generally a requirement for maximum inlet temperature.

With a converter valves adopted in direct-current transmission equipment as an example, primary cooling water directly used to cool the converter valve in a converter valve cooling apparatus is pure water, by which heat generated from a converter valve thyristor is carried away. In order to enable the cyclic utilization of the primary cooling water, the converter valve cooling apparatus must be equipped with special outdoor cooling apparatus.

FIG. 1 is a schematic diagram of a closed circulative cooling apparatus in the prior art. As shown in FIG. 1, the existing closed circulative cooling apparatus is mainly composed of a main circulation pump 1, a voltage stabilizer 2, a shunt water handling device 3, a water replenishing device 4, and a outdoor heat exchange device 5. The main circulation pump 1 is a power source for circulating primary cooling water for the converter valve; the voltage stabilizer 2 is a precondition-prerequisite and foundation of the steady operation of the system; the shunt water handling device 3 is an essential apparatus to guarantee that the quality of the primary cooling water may satiety the requirement of the converter valve; the water replenishing device 4 is a necessary supplemental installation in the event of water shortage in the system; the outdoor heat exchange device 5 is a core guarantee for the cooling requirement of the converter valve, without which the entire converter valve cooling apparatus may become ineffective.

There are mainly two types of common outdoor cooling apparatus: closed cooling towers and air coolers.

Air coolers have better performance when the ambient temperature is low. However as the ambient temperature rises, the performance of air coolers may significantly drop, or even lose their cooling function completely. Also, air coolers have larger power consumptions, leading to higher running cost.

Ambient temperature has a smaller effect on closed cooling towers, however vaporization may cause a larger water loss. In order to ensure the normal operation of closed cooling towers, it is necessary to continuously replenish water that is lost due to vaporization, and thus with higher running cost.

SUMMARY

A technical problem to be solved in the present disclosure is to provide a circulative cooling system and a method for controlling the circulative cooling system, so that water consumption and power consumption may be effectively reduced while cooling heat-generating devices.

According to an aspect of the present disclosure, a circulative cooling system is provided, comprising an internal cooling circulation device, a plate heat exchanger and an external cooling circulative device. The external cooling circulative device comprises an external cooling primary circulative pump and a cold-accumulation water pool, a water-air plate wing heat exchanger, a cold-accumulation air cooler, a first valve and a second valve. The internal cooling circulative device is adapted to circulatively cool a heat-generating device. The plate heat exchanger is adapted to perform heat exchange between external cooling water from the external cooling circulative device and internal cooling water from the internal cooling circulative device. The external cooling circulative device is adapted to cool the external cooling water. The external cooling primary circulation pump is adapted to drive the external cooling water to circulate in the external cooling circulative device. The cold accumulation water pool is adapted to store and cool the external cooling water and receive the external cooling water from the plate heat exchanger.

The water-air plate-wing heat exchanger is adapted to cool the external cooling water from the cold accumulation water pool and supply the external cooling water to the cold accumulation air cooler.

The cold accumulation air cooler is adapted to cool the external cooling water from the water-air plate-wing heat exchanger and supply the external cooling water to the plate heat exchanger.

The first valve is adapted to control the supplying of the external cooling water stored M the cold accumulation water pool to the plate heat exchanger and the second valve is adapted to control the supplying of the external cooling water stored in the cold accumulation water pool to the water-air plate-wing heat exchanger.

In one embodiment of the present invention, a temperature sensor adapted to measure ambient temperature periodically; a controller adapted to control the external cooling primary circulative pump, the cold accumulation air cooler, the first valve and the second valve of the external cooling circulative device according to the ambient temperature measured by the temperature sensor.

In another embodiment, the internal cooling circulative device comprises a internal cooling primary circulation pump, an internal cooling air cooler, a third valve, a fourth valve and a fifth valve. The internal cooling primary circulation pump is adapted to drive the internal cooling water to circulate in the internal cooling circulative device. The internal cooling air cooler is adapted to cool the internal cooling water heated by a heat generating device. The third valve is adapted to control the supplying of the internal cooling water by the internal cooling air cooler to the heat generating device. The fourth valve is adapted to control the supplying of the internal cooling water by the internal cooling air cooler to the plate heat exchanger. The fifth valve is adapted to control the supplying of the internal cooling water by the plate heat exchanger to the heat generating device.

In yet another embodiment, the controller further controls the internal cooling primary circulative pump, the internal cooling air cooler, the third valve, the fourth valve and the fifth valve of the internal cooling circulative device according to the ambient temperature measured by the temperature sensor.

In another embodiment, when the ambient temperature measured by the temperature sensor is not higher than a temperature T1, the controller turns on the external cooling primary circulative pump, the internal cooling primary circulative pump, and turns off fans of the internal cooling air cooler and the cold accumulation air cooler. The controller opens the second valve, the fourth valve, the fifth valve and closes the first valve and third valve.

In another embodiment, when the ambient temperature measured by the temperature sensor is lower than a temperature T0 and the operation of the heat generating device has been stopped, the controller opens the first valve and closes the second valve, wherein T0<T1.

In a further embodiment, when the ambient temperature measured by the temperature sensor is higher than the temperature T1 and is not higher than a temperature T2, the controller turns on the external cooling primary circulative pump and the internal cooling primary circulative pump; turns on the fan of the cold accumulation air cooler; and turns off the fan of the internal cooling air cooler; the controller opens the second valve, the fourth valve, the fifth valve, and closes the first valve and the third valve, wherein T1<T2.

In another embodiment, when the ambient temperature measured by the temperature sensor is higher than the temperature T2 and not higher than a temperature T3, the controller turns off the external cooling primary circulative pump and turns off the fan of the cold accumulation air cooler, turns on the internal cooling primary circulation pump and the fan of the internal cooling air cooler 212; meanwhile, opening the third valve, close the fourth valve and the fifth valve, wherein T2<T3. The internal cooling air cooler operates at a predetermined percentage of full power.

In another embodiment, when the ambient temperature measured by the temperature sensor is higher than the temperature T3 and not higher than a temperature T4, the controller turns on the external cooling primary circulative pump and the internal cooling primary circulative pump; turns on the fan of the internal cooling air cooler and turns off the fan of the cold accumulation air cooler; meanwhile, opening the second valve, the fourth valve, and the fifth valve, and closing the first valve and the third valve, wherein T3<T4 and the internal cooling air cooler operates at a predetermined percentage of full power.

In yet another embodiment, when the ambient temperature measured by the temperature sensor is higher than the temperature T4 and not higher than a temperature T5, the controller turns on the external cooling primary circulative pump and the internal cooling primary circulative pump; turns on the fan of the internal cooling air cooler and the fan of the cold accumulation air cooler; meanwhile, opening the second valve, the fourth valve, and the fifth valve, and closing the first valve and the third valve, wherein T4<T5 and the internal cooling air cooler operates at a predetermined percentage of full power.

In a further embodiment, when the ambient temperature measured by the temperature sensor is higher than the temperature T5 and not higher than a temperature T6, the controller turns off the external cooling primary circulative pump and turns off the fan of the cold accumulation air cooler, turns on the internal cooling primary circulative pump and the fan of the internal cooling air cooler; meanwhile, opening the third valve, closing the fourth valve and the fifth valve, wherein T5<T6 and the internal cooling air cooler operates at a predetermined percentage of full power.

In another embodiment, when the ambient temperature measured by the temperature sensor is higher than the temperature T6, the controller turns on the internal cooling primary circulative pump and the external cooling primary circulative pump; turns on the fan of the internal cooling air cooler and turns off the cold accumulation air cooler; meanwhile, opening the first valve, the fourth valve, and the fifth valve, and closing the second valve and the third valve; wherein the internal cooling air cooler operates at a predetermined percentage of full power.

In another embodiment, the system further comprises a first timer and a second timer. The first timer is adapted to start timing when the ambient temperature measured by the temperature sensor is higher than the temperature T6; when the first timer reaches M hours in timing, the controller shuts off the first timer; turns on the fan of the cold accumulation air cooler; opens the second valve and the third valve, and closes the first valve, the fourth valve, the fifth valve; and indicates the second timer to start timing and shuts off the second timer upon a N-hour time-out of the second timer; indicates the temperature sensor to start ambient temperature measurement again.

In one embodiment, M and N range from 10 to 12 hours.

According to another embodiment, a method for controlling a circulative cooling system is provided. The method includes measuring the ambient temperature periodically using a temperature sensor; controlling the external cooling primary circulative pump, the cold accumulation air cooler, the first valve and the second valve of the external cooling circulative device of the circulative cooling system by a controller according to the ambient temperature measured by the temperature sensor.

In another embodiment, the controller further controls the internal cooling primary circulative pump, the internal cooling air cooler, the third valve, the fourth valve and the fifth valve of the internal cooling circulative device according to the ambient temperature measured by the temperature sensor.

In yet another embodiment, when the ambient temperature measured by the temperature sensor is not higher than a temperature T1, the controller turns on the external cooling primary circulative pump, the internal cooling primary circulative pump; turns off fans of the internal cooling air cooler and the cold accumulation air cooler; meanwhile opens the second valve, the fourth valve, the fifth valve and closes the first valve and third valve.

In a further embodiment, when the ambient temperature measured by the temperature sensor is lower than a temperature T0 and the operation of the heat generating device has been stopped, the controller opens the first valve and closes the second valve, wherein T0<T1.

In another embodiment, when the ambient temperature measured by the temperature sensor is higher than the temperature T1 but is not higher than a temperature T2, the controller turns on the external cooling primary circulative pump and the internal cooling primary circulative pump; turns on the fan of the cold accumulation air cooler; turns off the fan of the internal cooling air cooler; meanwhile, opens the second valve, the fourth valve, the fifth valve; and closes the first valve and the third valve, wherein T1<T2.

In another embodiment, when the ambient temperature measured by the temperature sensor is higher than the temperature T2 but not higher than a temperature T3, the controller turns off the external cooling primary circulative pump and turns off the fan of the cold accumulation air cooler, turns on the internal cooling primary circulative pump and the fan of the internal cooling air cooler 212; meanwhile, opens the third valve, closes the fourth valve, and the fifth valve, wherein T2<T3 and the internal cooling air cooler operates at a predetermined percentage of power.

In another embodiment, when the ambient temperature measured by the temperature sensor is higher than the temperature T3 but not higher than a temperature T4, the controller turns on the external cooling primary circulative pump, the internal cooling primary circulative pump; turns on the fan of the internal cooling air cooler and turns off the fan of the cold accumulation air cooler; meanwhile, opens the second valve, the fourth valve, the fifth valve, and closes the first valve and the third valve, wherein T3<T4 and the internal cooling air cooler operates at a predetermined percentage of power.

In another embodiment, when the ambient temperature measured by the temperature sensor is higher than the temperature T4 but not higher than a temperature T5, the controller turns on the external cooling primary circulative pump, the internal cooling primary circulative pump; turns on the fan of the internal cooling air cooler and the fan of the cold accumulation air cooler; meanwhile, opens the second valve, the fourth valve, the fifth valve, and closes the first valve and the third valve, wherein T4<T5 and the internal cooling air cooler operates at a predetermined percentage of power.

In a further embodiment, when the ambient temperature measured by the temperature sensor is higher than the temperature T5 but not higher than a temperature T6, the controller turns off the external cooling primary circulative pump and turns off the fan of the cold accumulation air cooler, turns on the internal cooling primary circulative pump and the fan of the internal cooling air cooler; meanwhile, opens the third valve, closes the fourth valve, and the fifth valve, wherein T5<T6 and the internal cooling air cooler operates at a predetermined percentage of power.

In another embodiment, when the ambient temperature measured by the temperature sensor is higher than the temperature T6, the controller turns on the internal cooling primary circulative pump and the external cooling primary circulative pump; turns on the fan of the internal cooling air cooler and turns off the cold accumulation air cooler; meanwhile, opens the first valve, the fourth valve, the fifth valve, and closes the second valve and the third valve; wherein the internal cooling air cooler operates at a predetermined percentage of power.

In another embodiment, a first timer starts timing when the ambient temperature measured by the temperature sensor is higher than the temperature T6. The controller shuts off the first timer upon M-hour time out of first timer; turns on the fan of the cold accumulation air cooler; opens the second valve, the third valve, and closes the first valve, the fourth valve, the fifth valve; and indicates the second timer to start timing. The controller shuts off the second timer upon a N-hour time-out of the second timer; and indicates the temperature sensor to start ambient temperature measurement again.

In another embodiment, M and N range from 10 to 12 hours.

Thus, water consumption and power consumption may be effectively reduced while cooling the heat-generating device.

DETAILED DESCRIPTION OF THE PREFERRED EMBODIMENT

Below, a further complete description of the present disclosure will be given with reference to the drawings, in which exemplary embodiments of the present disclosure are described.

Figure 2:
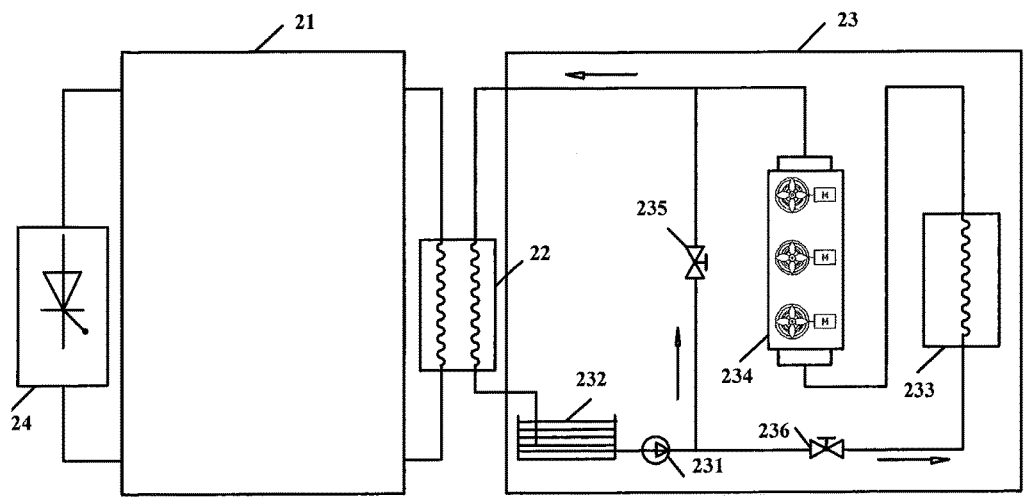
FIG. 2 is a schematic diagram of a circulative cooling system according to an embodiment of the present disclosure.

FIG. 2 is a schematic diagram of a circulative cooling system according to an embodiment of the present disclosure. As shown in FIG. 2, the circulative cooling system comprises an internal cooling circulative device 21, a plate heat exchanger 22 and an external cooling circulative device 23, wherein the external cooling circulative device 23 comprises an external cooling primary circulative pump 231, a cold accumulation water pool 232, a water-air plate-wing heat exchanger 233, a cold accumulation air cooler 234, a first valve 235 and a second valve 236, wherein:

The internal cooling circulative device 21 is used to perform circulative cooling on a heat-generating device.

The plate heat exchanger 22 is used to perform heat exchange between the external cooling water in the external cooling circulative device 23 and the internal cooling water in the internal cooling circulative device 21.

The external cooling circulative device 23 is used to cool the external cooling water the external cooling primary circulation pump 231 is used to drive the external cooling water to circulate in the external cooling circulative device 23. The cold accumulation water pool 232 is used to store and cool the external cooling water and receive the external cooling water supplied by the plate heat exchanger 22.

The water-air plate-wing heat exchanger 233 is used to cool the external cooling water supplied from the cold accumulation water pool 232 and supply the external cooling water to the cold accumulation air cooler 234.

The cold accumulation air cooler 234 is used to cool the external cooling water supplied from the water-air plate-wing heat exchanger 233 and supply the external cooling water to the plate heat exchanger 22.

The first valve 235 is used to control to supply the external cooling water stored in the cold accumulation water pool 232 to the plate heat exchanger 22.

The second valve 236 is used to control to supply the external cooling water stored in the cold accumulation water pool 232 to the plate-wing heat exchanger 233.

Based on the circulative cooling system provided in the embodiment of the present disclosure described above, the circulative cooling system comprises three parts: an internal cooling circulative device, a plate heat exchanger and an external cooling circulative device, wherein the internal cooling circulative device is used to perform circulating cooling on a heat-generating device; the plate heat exchanger is used to perform heat exchange between the external cooling water in the external cooling circulative device and the internal cooling water in the internal cooling circulative device; and the external cooling circulative device is used to cool the external cooling water. Also, the external cooling primary circulation pump, the cold accumulation water pool, the water-air plate-wing heat exchanger, the cold accumulation air cooler, the first valve and the second valve may be controlled, respectively. Thus, water consumption and power consumption may be effectively reduced while cooling the heat-generating device.

According to another particular embodiment of the present disclosure, the circulative cooling system further comprises a temperature sensor and a controller. The temperature sensor is used to periodically measure ambient temperature.

The controller is used to, according to the ambient temperature measured by the temperature sensor, control the external cooling primary circulation pump, the cold accumulation air cooler, the first valve and the second valve of the external cooling circulative device.

According to another particular embodiment of the present disclosure, the measurement period of the temperature sensor is half an hour, one hour, two hours or other appropriate time intervals.

Figure 3:
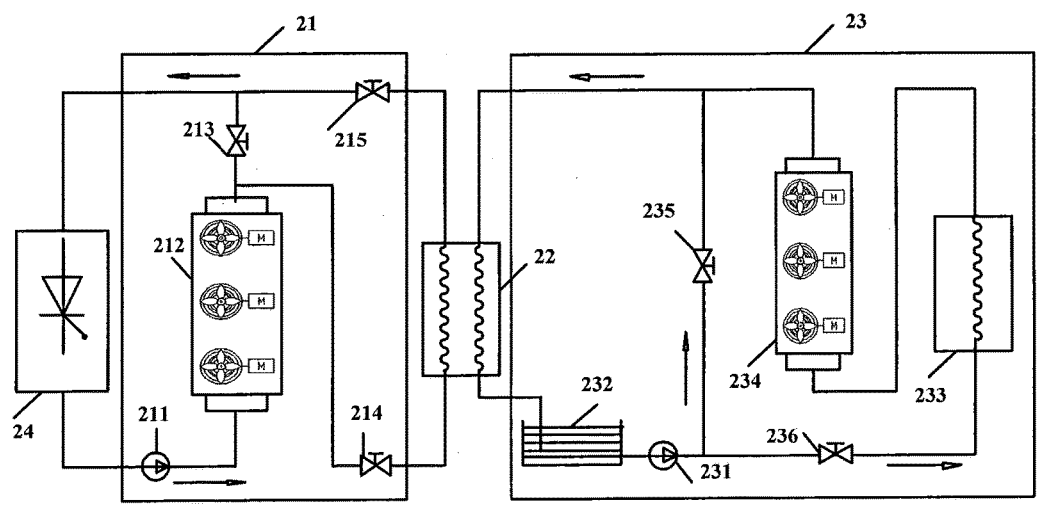
FIG. 3 is a schematic diagram of a circulative cooling system according to another embodiment of the present disclosure.

FIG. 3 is a schematic diagram of a circulative cooling system according to another embodiment of the present disclosure. The plate heat exchanger 22 and the external cooling circulative device 23 included in FIG. 3 are the same as the plate heat exchanger 22 and the external cooling circulative device 23 shown in FIG. 2. The internal cooling circulative device 21 in FIG. 3 comprises an internal cooling primary circulation pump 211, an internal cooling air cooler 212, a valve 213, a fourth valve 214 and a fifth valve 215. The internal cooling primary circulation pump 211 is used to drive the internal cooling water to circulate in the internal cooling circulative device 21.

The internal cooling air cooler 212 is used to cool the internal cooling water heated by the heat generating device. The third valve 213 is used to control the internal cooling air cooler 212 to supply the internal cooling water to the heat generating device. The fourth valve 214 is used to control the internal cooling air cooler 212 to supply the internal cooling water to the plate heat exchanger 22. The fifth valve 215 is used to control the plate heat exchanger 22 to supply the internal cooling water to the heat generating device.

According to another embodiment of the present disclosure, the controller of the circulative cooling system further controls the internal cooling primary circulation pump 211, internal cooling air cooler 212, third valve 213, fourth valve 214 and fifth valve 215 in the internal cooling circulative device 21 according to the ambient temperature periodicity measured by the temperature sensor.

According to another particular embodiment of the present disclosure, the measurement period of the temperature sensor is half hour, one hour, two hours or other appropriate time intervals.

Figure 4:
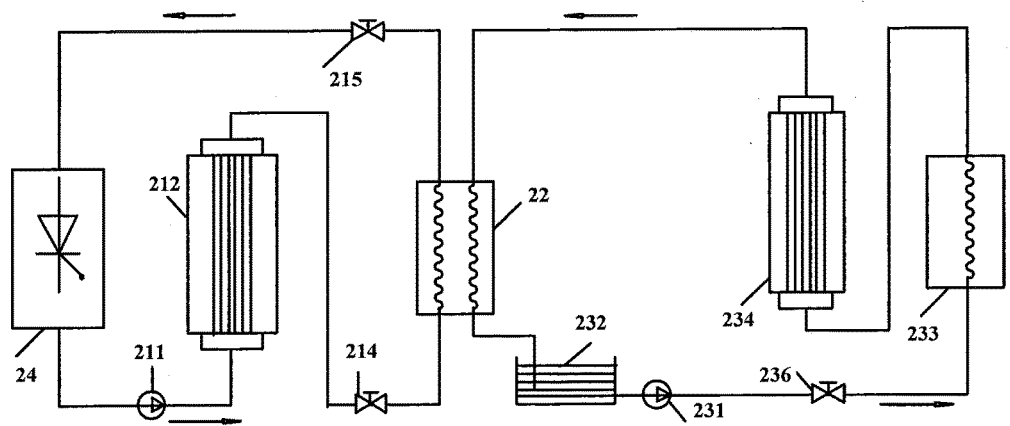
FIG. 4 is a schematic diagram of a circulative cooling system according to still another embodiment of the present disclosure.

FIG. 4 is a schematic diagram of a circulative cooling system according to another embodiment of the present disclosure. In FIG. 4, when the ambient temperature is not greater than a temperature T1, the controller turns on the external cooling primary circulation pump 231, the internal cooling primary circulation pump 211, turns off fans of the internal cooling air cooler 212 and the cold accumulation air cooler 234, opens the second valve 236, the fourth valve 214, the fifth valve 215 and closes the first valve 235, and third valve 213.

Wherein, the temperature T1 is determined depending on the lowest temperature of the environment where the system is used. In a particular embodiment of the present disclosure, T1 ranges from −10° C. to −5° C.

In the embodiment, due to the lower ambient temperature, fans of the internal cooling air cooler 212 and the cold accumulation air cooler 234 are completely turned off, and the system only depends on natural heat dissipation of the internal cooling air cooler 212 and the cold accumulation air cooler 234, as well as the naturally ventilated plate-wing heat exchanger 233 to meet the demand for cooling. In the embodiment, the maximum energy consumption of a typical circulative cooling system is merely 55 KW.

Figure 5:
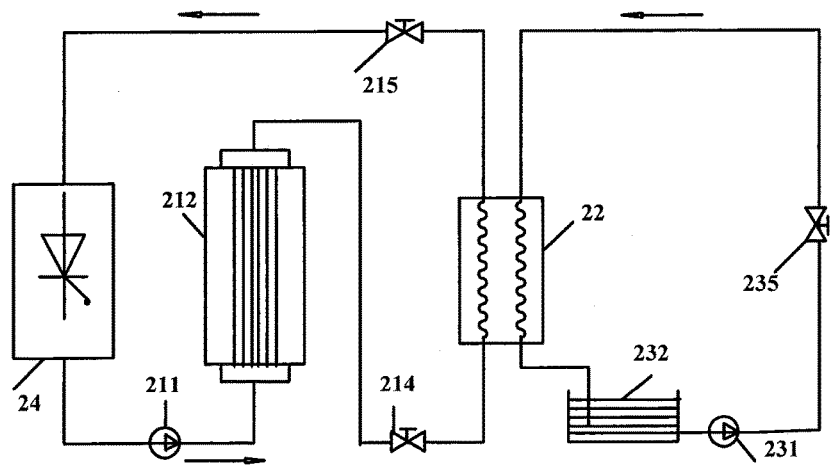
FIG. 5 is a schematic diagram of a circulative cooling system according to still another embodiment of the present disclosure.

FIG. 5 is a schematic diagram of a circulative cooling system according to another embodiment of the present disclosure. In FIG. 5, when the ambient temperature is lower than a temperature T0 and the operation of the heat generating device has been stopped, in order to prevent system freezing, water in the cold accumulation, water pool 232 which has a relatively higher temperature may be adopted as a compensation, wherein T0<T1, and T1 is same to the temperature T1 of the embodiment shown in FIG. 4. Particularly, on the basis of the embodiment shown in FIG. 4, the first valve 235 of the external cooling circulative device 23 is further opened, and the second valve 236 is closed. In a another embodiment of the present disclosure, T0 ranges from −20° C. to −10° C. In the embodiment, the maximum energy consumption of a typical circulative cooling system is 55 KW.

Figure 6:
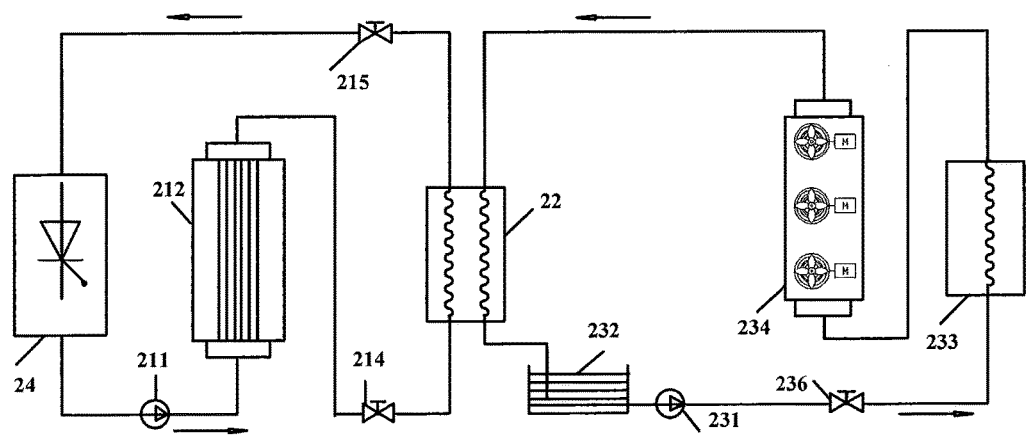
FIG. 6 is a schematic diagram of a circulative cooling system according to still another embodiment of the present disclosure.

FIG. 6 is a schematic diagram of a circulative cooling system according to another embodiment of the present disclosure. In FIG. 6, when the ambient temperature is higher than the temperature T1 but is not higher than a temperature T2, the controller turns on the external cooling primary circulation pump 231 and the internal cooling primary circulation pump 211; turns on the fan of the cold accumulation air cooler 234; turns off the fan of the internal cooling air cooler 212; meanwhile, opens the second valve 236, the fourth valve 214, the fifth valve 215; and closes the first valve 235 and the third valve 213, wherein T1<T2.

T1 is same to the temperature T1 of the embodiment shown in FIG. 5. T2 is determined based on the heat dissipating capacity of the internal cooling air cooler 212 in this ambient temperature range, and the designed cooling capacity margin of the water-air plate-wing heat exchanger 233 and the cold accumulation air cooler 234 that are naturally ventilated, the larger the margin is, the higher the temperature T2 is. In another embodiment of the present disclosure, T2 ranges from 5° C. to 10° C. The system may meet the demand for cooling only depending on the natural heat dissipation of the internal cooling air cooler 212, the heat dissipation of the cold accumulation air cooler 234 through forced ventilation and the natural ventilation of the plate-wing heat exchanger 233. In this embodiment, the maximum energy consumption of a typical circulative cooling system is 121 KW.

Figure 7:
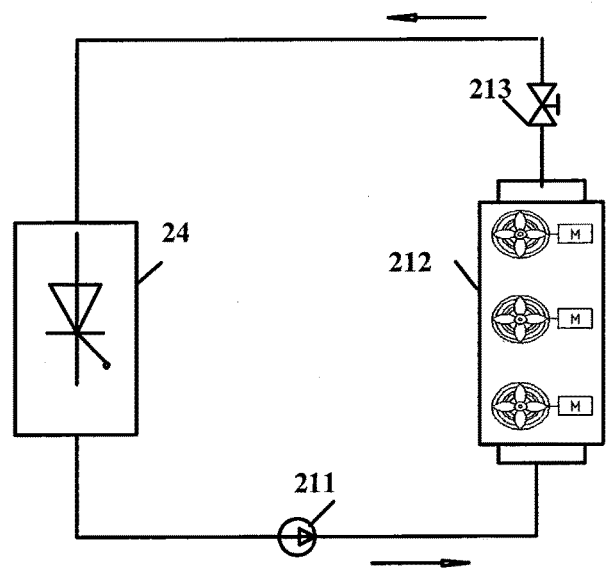
FIG. 7 is a schematic diagram of a circulative cooling system according to still another embodiment of the present disclosure.

FIG. 7 is a schematic diagram of a circulative cooling system according to another embodiment of the present disclosure. In FIG. 7, when the ambient temperature is higher than a temperature T2 but not higher than a temperature T3, the controller turns off the external cooling primary circulation pump 231 and turns off the fan of the cold accumulation air cooler 234, turns on the internal cooling primary circulation pump 211, the fan of the internal cooling air cooler 212; at the same time, opens the third valve 213, closes the fourth valve 214, and the fifth valve 215, wherein T2<T3 and the internal cooling air cooler 212 operates at a predetermined percentage of power. In a particular embodiment of the present disclosure, the internal cooling air cooler 212 operates at 50% power.

In this embodiment, T2 is same to the temperature T2 of the embodiment shown in FIG. 6. T3 is determined based on the designed cooling capacity margin of the internal cooling air cooler 212 in this ambient temperature range. The larger the margin is, the higher the temperature T3 is. In a particular embodiment of the present disclosure, T3 ranges from 15° C. to 20° C.

In this embodiment, the system may meet the demand for cooling at 50% power of the internal cooling air cooler 212. In this embodiment, the maximum energy consumption of a typical circulative cooling system is 132 KW.

Figure 8:
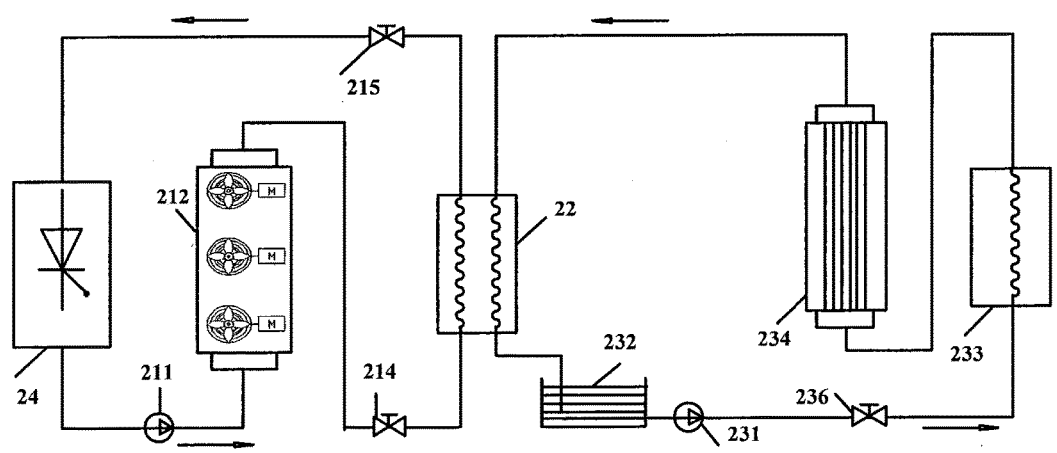
FIG. 8 is a schematic diagram of a circulative cooling system according to still another embodiment of the present disclosure.

FIG. 8 is a schematic diagram of a circulative cooling system according to another embodiment of the present disclosure. In FIG. 8, when the ambient temperature is higher than a temperature T3 but is not higher than a temperature T4, the controller turns on the external cooling primary circulation pump 231, the internal cooling primary circulation pump 211; turns on the fan of the internal cooling air cooler 212 and turns off the fan of the cold accumulation air cooler 234; meanwhile, opens the second valve 236, the fourth valve 214, the fifth valve 215, and closes the first valve 235 and the third valve 213, wherein T3<T4 and the internal cooling air cooler 212 operates at a predetermined percentage of power. In a particular embodiment of the present disclosure, the internal cooling air cooler 212 operates at 62% power.

In this embodiment, T3 is same to the temperature T3 of the embodiment shown in FIG. 7. T4 is determined based on the designed cooling capacity margin of the internal cooling air cooler 212 and the designed capacity of the water-air plate-wing heat exchanger in this ambient temperature range, the larger any of the two designed capacities is, the higher the temperature T4 is. However, in view of energy saving and cost of investment, it is beneficial to increase the design margin of the water-air plate-wing heat exchanger. In a particular embodiment of the present disclosure, T4 ranges from 20° C. to 30° C.

In this embodiment, the demand for cooling may be met only depending on the internal cooling air cooler 212, or the natural cooling of the cold accumulation water pool 232 at night and starting the plate heat exchanger 233 in daytime as an auxiliary cooling device of the internal cooling air cooler 212. Without question, the cooling system may become more energy efficient if the internal cooling air cooler 212 operates at its full capability in conjunction with the water-air plate-wing heat exchanger 233. In this embodiment, the maximum energy consumption of a typical circulative cooling system is 220 KW, and the energy consumption may reduce by 20% at night.

Figure 9:
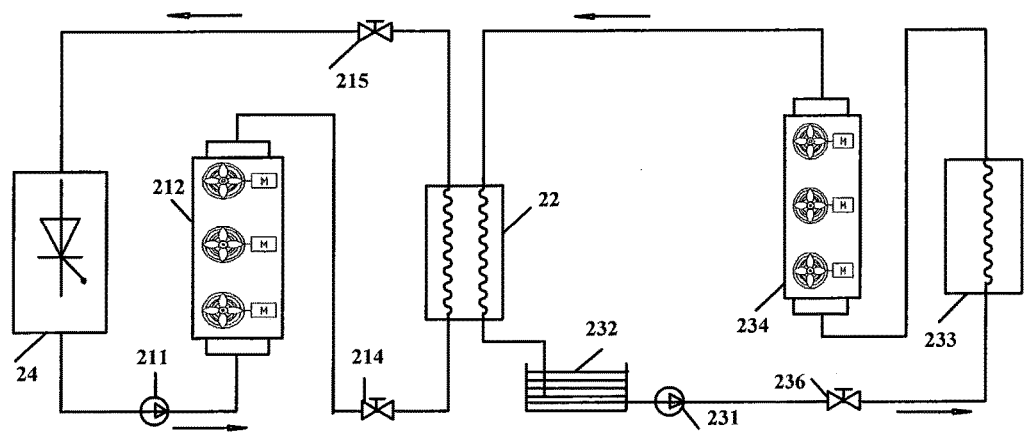
FIG. 9 is a schematic diagram of a circulative cooling system according to still another embodiment of the present disclosure.

FIG. 9 is a schematic diagram of a circulative cooling system according to another embodiment of the present disclosure. In FIG. 9, when the ambient temperature is higher than a temperature T4 but is not higher than a temperature T5, the controller turns on the external cooling primary circulation pump 231, the internal cooling primary circulation pump 211; turns on the fan of the internal cooling air cooler 212 and the fan of the cold accumulation air cooler 234; meanwhile, opens the second valve 236, the fourth valve 214, the fifth valve 215, and closes the first valve 235 and the third valve 213, wherein T4<T5 and the internal cooling air cooler 212 operates at a predetermined percentage of power. In a particular embodiment of the present disclosure, the internal cooling air cooler 212 operates at 70% power.

In this embodiment, T4 is same to the temperature T4 of the embodiment shown in FIG. 8. T5 is determined based on the designed capacity of the water-air plate-wing heat exchanger in this ambient temperature range. The larger the designed cooling capacity margin is, the higher the temperature T5 is. In a particular embodiment of the present disclosure, T5 ranges from 30° C. to 37° C.

In this embodiment, the demand for cooling may be met only depending on the internal cooling air cooler 212, or the natural cooling of the cold accumulation water pool 232 at night and starting the plate heat exchanger 233 in daytime as an auxiliary cooling device of the internal cooling air cooler 212. Without question, the cooling system may operate in a more energy-saving manner if the fans of the internal cooling air cooler 212 and the cold accumulation air cooler 234 operate at their full capabilities in conjunction with the water-air plate-wing heat exchanger 233. Certainly, the fan of the cold accumulation air cooler 234 may be started at night to further cool the external cooling water. In this embodiment, the maximum energy consumption of a typical circulative cooling system is 240 KW.

Figure 10:
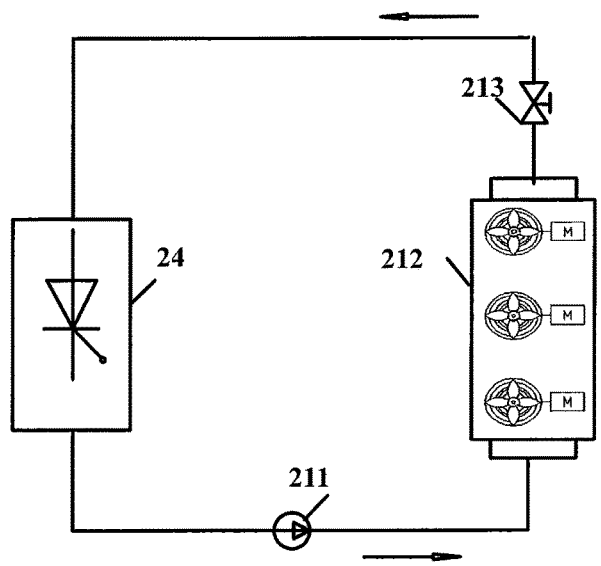
FIG. 10 is a schematic diagram of a circulative cooling system according to still another embodiment of the present disclosure.

FIG. 10 is a schematic diagram of a circulative cooling system according to another embodiment of the present disclosure. In FIG. 10, when the ambient temperature is higher than a temperature T5 but not higher than a temperature T6, the controller turns off the external cooling primary circulation pump 231 and turns off the fan of the cold accumulation air cooler 234, turns on the internal cooling primary circulation pump 211, and the fan of the internal cooling air cooler 212; at the same time, opens the third valve 213, closes the fourth valve 214, and the fifth valve 215, wherein T5<T6 and the internal cooling air cooler 212 operates at a predetermined percentage of power. In a particular embodiment of the present disclosure, the internal cooling air cooler 212 operates at 100% power.

In this embodiment, T5 is same to the temperature T5 of the embodiment shown in FIG. 9. T6 is determined based on the maximum temperature in an extreme environment where the system is located, in a particular embodiment of the present disclosure, T6 ranges from 38° C. to 42° C. The maximum energy consumption of a typical circulative cooling system is 285 KW.

Figure 11:
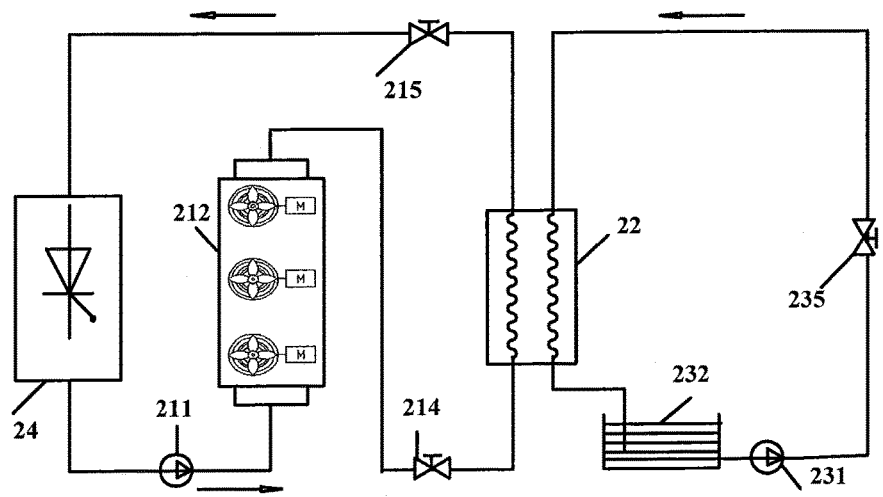
FIG. 11 is a schematic diagram of a circulative cooling system according to still another embodiment of the present disclosure.

FIG. 11 is a schematic diagram of a circulative cooling system according to another embodiment of the present disclosure. In FIG. 11, when the ambient temperature is higher than a temperature T6, the controller turns on the internal cooling primary circulation pump 211 and the external cooling primary circulation pump 231; turns on the fan of the internal cooling air cooler 212 and turns off the cold accumulation air cooler 234; meanwhile opens the first valve 235, the fourth valve 214, the fifth valve 215, and closes the second valve 236 and the third valve 213. Wherein T6 is same to the temperature T6 of the embodiment shown in FIG. 10, and the internal cooling air cooler 212 operates at a predetermined percentage of power. In a particular embodiment of the present disclosure, the internal cooling air cooler 212 operates at 100% power.

Figure 12:
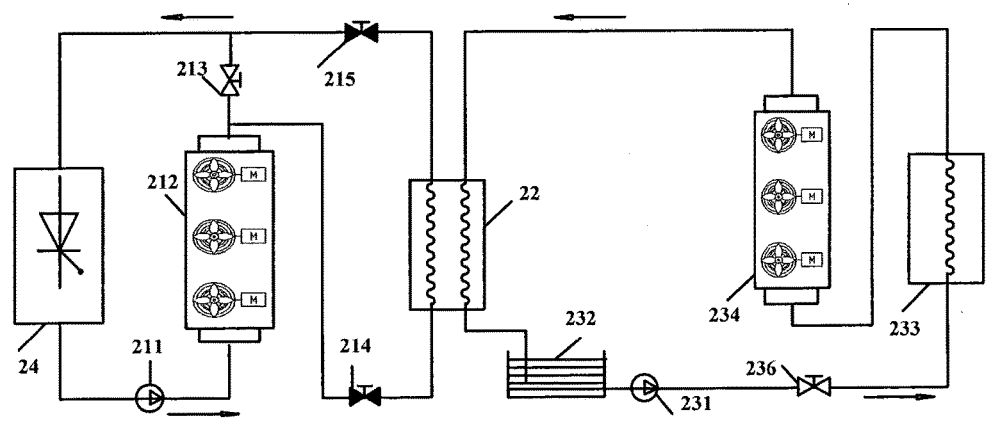
FIG. 12 is a schematic diagram of a circulative cooling system according to still another embodiment of the present disclosure.

FIG. 12 is a schematic diagram of a circulative cooling system according to another embodiment of the present disclosure. In order to further reduce energy consumption, when the ambient temperature is higher than a temperature T6, in addition to the controlling processes as shown in FIG. 11, the controller further indicates the temperature sensor to stop environment temperature measurement.

The system further comprises a first timer and a second timer, wherein:

The first timer is used to start timing when the ambient temperature measured by the temperature sensor is higher than the temperature T6.

Further, the controller shuts off the first timer after M-hour time out of first timer, on the basis of the control shown in FIG. 11, turns on the fan of the cold accumulation air cooler 234, opens the second valve 236, the third valve 213, and closes the first valve 235, the fourth valve 214, the fifth valve 215, as shown in FIG. 12; and indicates the second timer to start timing, and after a N-hour time-out of second timer, indicates the temperature sensor to start ambient temperature measurement again.

According to another particular embodiment of the present disclosure, M and N range from 10 to 12 hours.

For example, when the temperature exceeds 38° C. during the daytime, the system may adopt the cooling scheme of the embodiment shown in FIG. 11 within the M hours specified by the first timer, after which it may be at night or the temperature may drop below 38° C. significantly, at this point, forced ventilation may be performed on the internal cooling water using the internal cooling air cooler 212; on the other hand, the external cooling water may be cooled for N hours through the forced ventilation of the cold accumulation air cooler 234 and the natural cooling of the water-air plate-wing heat exchanger 233, so that energy consumption may be reduced when cooling with external cooling water that has been cooled during the daytime at higher temperature.

In this embodiment, the maximum energy consumption of a typical circulative cooling system is 319 KW.

According to the above embodiment, the circulative cooling system has the following operation features:

At a lower ambient temperature, such as a ambient temperature less than T2, the internal cooling air cooler is completely stopped, and the external cooling circulative apparatus may realize cooling only depending on the water-air plate-wing heat exchanger and the cold accumulation air cooler.

At a higher ambient temperature, such as an ambient temperature between T2 and T6, cooling may be realized through the forced ventilation of the internal cooling air cooler and other methods.

When the ambient temperature is higher than a value, for example, T6, at this point, the air cooler may not provide enough cooling capability to meet the demand for cooling, and thus it is necessary to use the external cooling water that has been cooled at night as a heat-eliminating medium of the internal cooling water, so as to effectively ensure that the requirement of the heat generating device in terms of cooling capacity and cooling water temperature may be met even at the highest environment temperature.

Table 1 shows the maximum energy consumption of the embodiments shown in FIG. 4-FIG. 12 described above.

TABLE 1

|  | FIG. 4 | FIG. 5 | FIG. 6 | FIG. 7 | FIG. 8 | FIG. 9 | FIG. 10 | FIG. 11 and FIG. 12 |
|---|---|---|---|---|---|---|---|---|
| energy consumption (KW) | 55 | 55 | 121 | 132 | 220 | 240 | 285 | 319 |
| Effect of energy saving | 82.7% | 82.7% | 62.1% | 58.6% | 31% | 24.8% | 10.7% | — |

It can be seen from table 1 that, as compared to the prior art, the present disclosure may achieve an significantly improved energy saving effect, and the lower the ambient temperature is, the better energy saving effect may be achieved.

Figure 13:
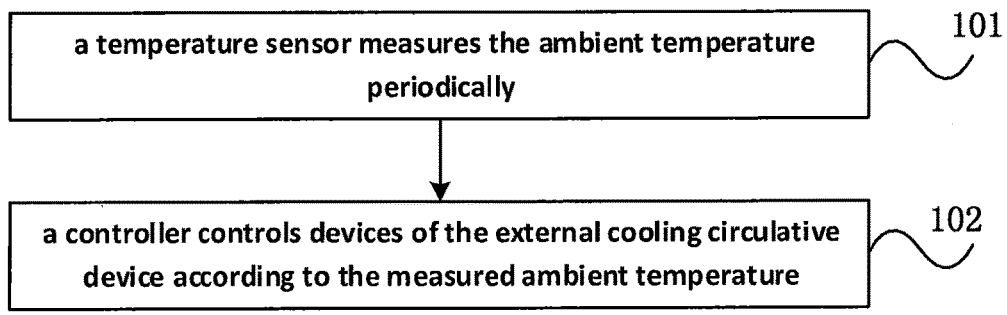
FIG. 13 is a schematic diagram of a method for controlling a control circulative cooling system according to an embodiment of the present disclosure.

FIG. 13 is a schematic diagram showing an embodiment of a method for controlling a circulative cooling system. As shown in FIG. 13, the method for controlling the circulative cooling system is as follows.

Figure 1:
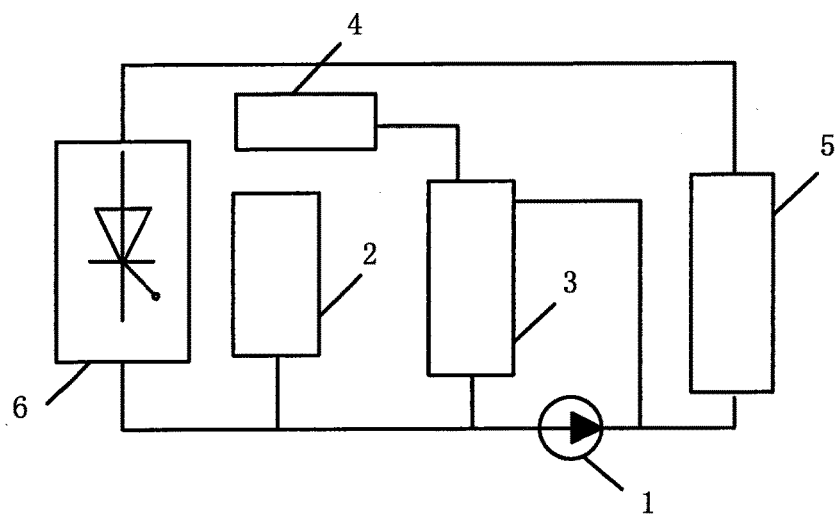
FIG. 1 is a schematic diagram of a closed circulative cooling apparatus in the prior art.

Step 101: A temperature sensor measures ambient temperature periodically;

Step 102: According to the ambient temperature measured by the temperature sensor, a controller controls the external cooling primary circulation pump, the cold accumulation air cooler, the first valve, and the second valve of the external cooling circulative device of the embodiment shown in FIG. 1.

Based on the method for controlling a circulative cooling system provided in the embodiment described above of the present disclosure, the circulative cooling system comprises three parts: an internal cooling circulative device, a plate heat exchanger and an external cooling circulative device, wherein the internal cooling circulative device is used to perform circulating cooling on a heat generating device; the plate heat exchanger is used to perform heat exchange between external cooling water in the external cooling circulative device and the internal cooling water in the internal cooling circulative device; and the external cooling circulative device is used to cool the external cooling water. Also, an external cooling primary circulation pump, a cold accumulation water pool, a water-air plate-wing heat exchanger, a cold accumulation air cooler, a first valve and a second valve provided in the external cooling circulative device may be controlled respectively. Thus, water consumption and power consumption may be effectively reduced while effectively cooling the heat generating device.

According to another particular embodiment of the present disclosure, the measurement period of the temperature sensor is half hour, one hour, two hours or other appropriate time intervals.

Figure 14:
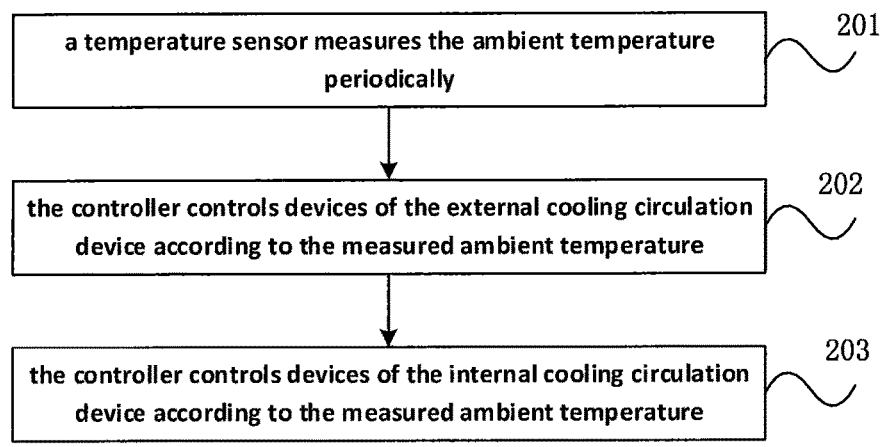
FIG. 14 is a schematic diagram of a method for controlling a circulative cooling system according to another embodiment of the present disclosure.

FIG. 14 is a schematic diagram showing an embodiment of a method for controlling a circulative cooling system. As shown in FIG. 14, the method for controlling the circulative cooling system is as follows.

Step 201: The temperature sensor measures ambient temperature periodically.

Step 202: The controller controls the external cooling primary circulation pump, the cold accumulation air cooler, the first valve, and the second valve of the external cooling circulating device in the embodiment shown in FIG. 1 according to the ambient temperature measured by the temperature sensor.

Step 203: The controller controls the internal cooling primary circulation pump, the internal cooling air cooler, the third valve, the fourth valve and the fifth valve of the internal cooling circulative device in the embodiment shown in FIG. 3 according to the ambient temperature measured by the temperature sensor.

Figure 15:
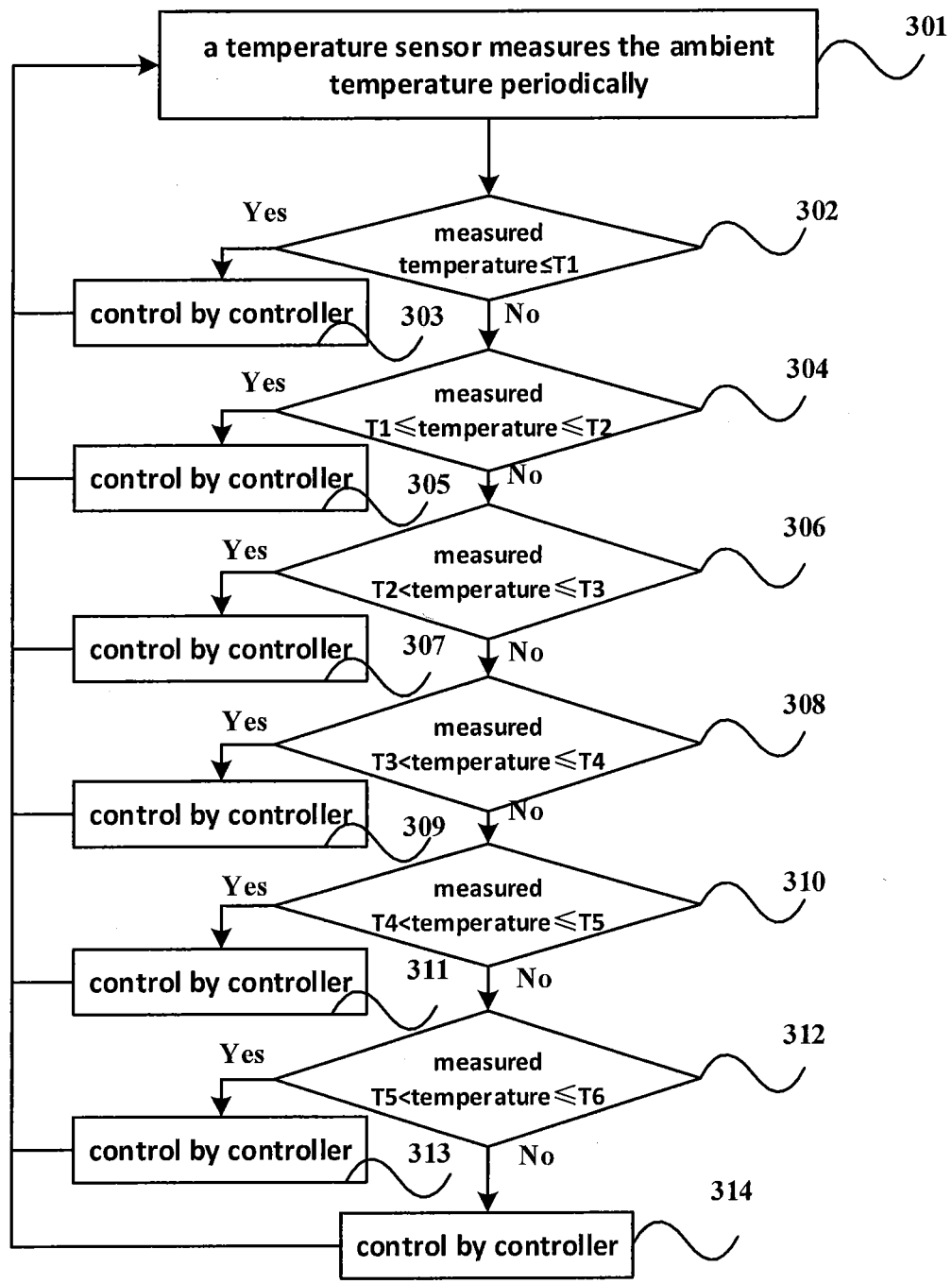
FIG. 15 is a schematic diagram of a method for controlling a circulative cooling system according to another embodiment of the present disclosure.

FIG. 15 is a schematic diagram of an embodiment of a method for controlling a circulative cooling system. As shown in FIG. 15, the method for controlling a circulative cooling system is as follows:

Step 301: A temperature sensor measures ambient temperature periodically.

Step 302: the controller determines whether the ambient temperature is not higher than T1, if the ambient temperature is higher than T1, step 304 is executed; otherwise if the ambient temperature is not larger than T1, step 303 is executed. Wherein, T1 ranges from −10° C. to −5° C.

Step 303: the controller tunes on the external cooling primary circulation pump, the internal cooling primary circulation pump; turns off the fans of the cold accumulation air cooler and the internal cooling air cooler; meanwhile, opens the second valve, the fourth valve, the fifth valve and closes the first valve, the third valve. Then the process returns to step 301.

In another embodiment of the present disclosure, when the ambient temperature is lower than T0 and the operation of the heat generating device has been stopped, the controller further opens the first valve and closes the second valve on the basis of the operation of step 303. Then, the process returns to step 301.

Wherein, T0<T1, and T0 ranges from −15° C. to −5° C.

Step 304: the controller determines whether the ambient temperature is higher than a temperature T1 and is not higher than a temperature T2; when the ambient temperature meets this condition, step 305 is executed; otherwise, step 306 is executed. Wherein, T2>T1, and T2 ranges from −5° C. to 10° C.

Step 305: the controller turns on the external cooling primary circulation pump, the internal cooling primary circulation pump, turns on the fan of the cold accumulation air cooler and turns off the fan of the internal cooling air cooler; meanwhile, opens the second valve, the fourth valve, the fifth valve and closes the first valve, the third valve. Then, the process returns to step 301.

Step 306: the controller determines whether the ambient temperature is higher than a temperature T2 but is not higher than a temperature T3; when the ambient temperature meets this condition, step 307 is executed; otherwise, step 308 is executed, wherein, T3>T2, and T3 ranges from 15° C. to 20° C.

Step 307: the controller turns off the external cooling primary circulation pump and turns off the fan of the cold accumulation air cooler; turns on the internal cooling primary circulation pump and turns on the fan of the internal cooling air cooler; meanwhile, opens the third valve and closes the fourth valve, the fifth valve; wherein the internal cooling air cooler operates at a predetermined percentage of power. In an embodiment of the present disclosure, the internal cooling air cooler operates at 50% power. Then, the process returns to step 301.

Step 308: the controller determines whether the ambient temperature is higher than a temperature T3 but is not higher than a temperature T4; when the ambient temperature meets this condition, step 309 is executed; otherwise, step 310 is executed, wherein, T4>T3, and T4 ranges from 20° C. to 30° C.

Step 309: the controller turns on the external cooling primary circulation pump, the internal cooling primary circulation pump; turns on the fan of the internal cooling air cooler and turns off the fan of the cold accumulation air cooler; meanwhile, opens the second valve, the fourth valve, the fifth valve and closes the first valve, the third valve; wherein the internal cooling air cooler operates at a predetermined percentage of power. In an embodiment of the present disclosure, the internal cooling air cooler operates at 62% power. Then, the process returns to step 301.

Step 310: the controller determines whether the ambient temperature is higher than a temperature T4 but is not higher than a temperature T5; when the ambient temperature meets this condition, step 311 is executed; otherwise, step 312 is executed, wherein, T5>T4, and T5 ranges from 30° C. to 37° C.

Step 311: the controller turns on the external cooling primary circulation pump, the internal cooling primary circulation pump; turns on the fan of the internal cooling air cooler and the fan of the cold accumulation air cooler; meanwhile, opens the second valve, the fourth valve, the fifth valve and closes the first valve, the third valve; wherein the internal cooling air cooler operates at a predetermined percentage of power. In an embodiment of the present disclosure, the internal cooling air cooler operates at 70% power. Then, the process returns to step 301.

Step 312: the controller determines whether the ambient temperature is higher than a temperature T5 but is not higher than a temperature T6; when the ambient temperature meets this condition, step 313 is executed; otherwise, step 314 is executed, wherein, T6>T5, and T6 ranges from 38° C. to 42° C.

Step 313: the controller turns off the external cooling primary circulation pump and the fan of the cold accumulation air cooler; turns on the internal cooling primary circulation pump and the fan of internal cooling air cooler; meanwhile, opens the third valve and closes the fourth valve, the fifth valve; wherein the internal cooling air cooler operates at a predetermined percentage of power. In an embodiment of the present disclosure, the internal cooling air cooler operates at 100% power. Then, the process returns to step 301.

Step 314: the controller turns on the internal cooling primary circulation pump, the external cooling primary circulation pump; turns on the fan of internal cooling air cooler and turns off the fan of cold accumulation air cooler; meanwhile, opens the first valve, fourth valve, fifth valve and closes the second valve, the third valve; wherein the internal cooling air cooler operates at a predetermined percentage of power. In an embodiment of the present disclosure, the internal cooling air cooler operates at 100% power. Then, the process returns to step 301.

In another embodiment of the present disclosure, when the ambient temperature is higher than T6, the controller performs controls subsequent to step 309; the temperature sensor stops ambient temperature measurement; the first timer starts timing; the controller shuts off the first timer upon M-hour time out of the first timer and turns on the fan of the cold accumulation air cooler 234; opens the second valve 236, the third valve 213 and closes the first valve 235, the fourth valve 214, the fifth valve 215; and indicates the second timer to start timing. Upon N-hour time out of the second timer, the second timer is shut off. The temperature sensor starts ambient temperature measurement again. Then, the process returns to step 301.

According to another embodiment of the present disclosure, M and N ranges from 10 to 12 hours.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable those of ordinary skill in the art to understand the disclosure for various embodiments with various modifications as are suited to the particular use contemplated.

What is claimed is:

1. A circulative cooling system, comprising an internal cooling circulative device, a plate heat exchanger and an external cooling circulative device, wherein the external cooling cirulative device comprises an external cooling primary circulation pump and a cold-accumulation water pool, a water-air plate wing heat exchanger, a cold-accumulation air cooler, and a first valve and a second valve, wherein:
   the internal cooling circulative device is adapted to circulatingly cool a heat-generating device;
   the plate heat exchanger is adapted to perform heat exchange between external cooling water from the external cooling circulating device and internal cooling water from the internal cooling circulative device;
   the external cooling circulative device is adapted to cool the external cooling water, wherein in the external cooling circulative device;
   the external cooling primary circulation pump is adapted to drive the external cooling water to circulate in the external cooling circulation device;
   the cold accumulation water pool is adapted to store and cool the external cooling water, and receive the external cooling water from the plate heat exchanger;
   the water-air plate-wing heat exchanger is adapted to cool the external cooling water from the cold accumulation water pool, and supply the external cooling water to the cold accumulation air cooler;
   the cold accumulation air cooler is adapted to cool the external cooling water from the water-air plate-wing heat exchanger, and supply the external cooling water to the plate heat exchanger;
   the first valve is adapted to control the supplying of the external cooling water stored in the cold accumulation water pool to the plate heat exchanger;
   the second valve is adapted to control the supplying of the external cooling water stored in the cold accumulation water pool to the water-air plate-wing heat exchanger.

2. The system according to claim 1, wherein the system further comprises:
   a temperature sensor adapted to measure ambient temperature periodically;
   a controller adapted to control the external cooling primary circulation pump, the cold accumulation air cooler, the first valve and the second valve of the external cooling circulation device according to the ambient temperature measured by the temperature sensor.

3. The system according to claim 2, wherein the internal cooling circulation device comprises a internal cooling primary circulation pump, an internal cooling air cooler, a third valve, a fourth valve and a fifth valve; wherein, in the internal cooling circulation device:
   the internal cooling primary circulation pump is adapted to drive the internal cooling water to circulate in the internal cooling circulation device;
   the internal cooling air cooler is adapted to cool the internal cooling water heated by a heat generating device;
   the third valve is adapted to control the supplying of the internal cooling water by the internal cooling air cooler to the heat generating device;
   the fourth valve is adapted to control the supplying of the internal cooling water by the internal cooling air cooler to the plate heat exchanger;
   the fifth valve is adapted to control the supplying of the internal cooling water by the plate heat exchanger to the heat generating device.

4. The system according to claim 3, wherein the controller further controls the internal cooling primary circulation pump, the internal cooling air cooler, the third valve, the fourth valve and the fifth valve of the internal cooling circulation device according to the ambient temperature measured by the temperature sensor.

5. The system according to claim 4, wherein when the ambient temperature measured by the temperature sensor is not higher than a temperature T1, the controller is configured to turn on the external cooling primary circulation pump, the internal cooling primary circulation pump, and to turn off fans of the internal cooling air cooler and the cold accumulation air cooler, to open the second valve, the fourth valve, the fifth valve and to close the first valve and third valve.

6. The system according to claim 5, wherein when the ambient temperature measured by the temperature sensor is lower than a temperature T0 and the operation of the heat generating device has been stopped, the controller is configured to open the first valve and close the second valve, wherein T0<T1.

7. The system according to claim 5, wherein when the ambient temperature measured by the temperature sensor is higher than the temperature T1 and is not higher than a temperature T2, the controller is configured to turn on the external cooling primary circulation pump and the internal cooling primary circulation pump; to turn on the fan of the cold accumulation air cooler; to turn off the fan of the internal cooling air cooler; to open the second valve, the fourth valve, the fifth valve, and to close the first valve and the third valve, wherein T1<T2.

8. The system according to claim 7, wherein
when the ambient temperature measured by the temperature sensor is higher than the temperature T2 and not higher than a temperature T3, the controller is configured to turn off the external cooling primary circulation pump and turn off the fan of the cold accumulation air cooler, turn on the internal cooling primary circulation pump and the fan of the internal cooling air cooler; open the third valve, close the fourth valve and the fifth valve, wherein T2<T3 and the internal cooling air cooler operates at a predetermined percentage of full power.

9. The system according to claim 8, wherein
when the ambient temperature measured by the temperature sensor is higher than the temperature T3 and not higher than a temperature T4, the controller is configured to turn on the external cooling primary circulation pump and the internal cooling primary circulation pump; turn on the fan of the internal cooling air cooler and turn off the fan of the cold accumulation air cooler; open the second valve, the fourth valve, and the fifth valve, and close the first valve and the third valve, wherein T3<T4 and the internal cooling air cooler operates at a predetermined percentage of full power.

10. The system according to claim 9, wherein
when the ambient temperature measured by the temperature sensor is higher than the temperature T4 and not higher than a temperature T5, the controller is configured to turn on the external cooling primary circulation pump and the internal cooling primary circulation pump; turn on the fan of the internal cooling air cooler and the fan of the cold accumulation air cooler; meanwhile, open the second valve, the fourth valve, and the fifth valve, and close the first valve and the third valve, wherein T4<T5 and the internal cooling air cooler operates at a predetermined percentage of full power.

11. The system according to claim 10, wherein
when the ambient temperature measured by the temperature sensor is higher than the temperature T5 and not higher than a temperature T6, the controller is configured to turn off the external cooling primary circulation pump and turn off the fan of the cold accumulation air cooler, turn on the internal cooling primary circulation pump and the fan of the internal cooling air cooler; open the third valve, and close the fourth valve and the fifth valve, wherein T5<T6 and the internal cooling air cooler operates at a predetermined percentage of full power.

12. The system according to claim 11, wherein
when the ambient temperature measured by the temperature sensor is higher than the temperature T6, the controller is configured to turn on the internal cooling primary circulation pump and the external cooling primary circulation pump; turn on the fan of the internal cooling air cooler and turns off the cold accumulation air cooler; open the first valve, the fourth valve, and the fifth valve, and close the second valve and the third valve; wherein the internal cooling air cooler operates at a predetermined percentage of full power.

13. The system according to claim 12, wherein the system further comprises a first timer and a second timer, wherein:
the first timer is adapted to start timing when the ambient temperature measured by the temperature sensor is higher than the temperature T6;
when the first timer reaches M hours in timing, the controller shuts off the first timer; turns on the fan of the cold accumulation air cooler; opens the second valve and the third valve, and closes the first valve, the fourth valve, the fifth valve; indicates that the second timer starts timing and shuts off the second timer upon a N-hour time-out of the second timer;
and indicates that the temperature sensor starts an ambient temperature measurement again.

14. The system according to claim 13, wherein M and N range from 10 to 12 hours.

15. A method for controlling a circulative cooling system comprising: an internal cooling circulation device, a plate heat exchanger and an external cooling circulation device, wherein the external cooling circulation device comprises an external cooling primary circulation pump and a cold-accumulation water pool, a water-air plate wing heat exchanger, a cold-accumulation air cooler, and a first valve and a second valve, the method comprising:
measuring ambient temperature periodically using a temperature sensor;
controlling the external cooling primary circulation pump, the cold accumulation air cooler, the first valve and the second valve of the external cooling circulation device of the circulative cooling system by a controller according to the ambient temperature measured by the temperature sensor.

16. The method according to claim 15, wherein the internal cooling circulation device comprises a internal cooling primary circulation pump, an internal cooling air cooler, a third valve, a fourth valve and a fifth valve, the method further comprising controlling with the controller the internal cooling primary circulation pump, the internal cooling air cooler, the third valve, the fourth valve and the fifth valve of the internal cooling circulation device according to the ambient temperature measured by the temperature sensor.

17. The method according to claim 16, further comprising:
when the ambient temperature measured by the temperature sensor is not higher than a temperature T1, turning on with the controller the external cooling primary circulation pump, the internal cooling primary circulation pump; turning off fans of the internal cooling air cooler and the cold accumulation air cooler; opening the second valve, the fourth valve, the fifth valve and closing the first valve and third valve.

18. The method according to claim 17, further comprising: when the ambient temperature measured by the temperature sensor is lower than a temperature T0 and the operation of the heat generating device has been stopped, opening the first valve and closing the second valve, wherein T0<T1.

19. The method according to claim 17, further comprising:
when the ambient temperature measured by the temperature sensor is higher than the temperature T1 but is not higher than a temperature T2, turning on the external cooling primary circulation pump and the internal cooling primary circulation pump; turning on the fan of the cold accumulation air cooler; turning off the fan of the internal cooling air cooler; opening the second valve, the fourth valve, the fifth valve; and closing the first valve and the third valve, wherein T1<T2.

20. The method according to claim 19, further comprising:
when the ambient temperature measured by the temperature sensor is higher than the temperature T2 but not higher than a temperature T3, turning off the external cooling primary circulation pump and turning off the fan of the cold accumulation air cooler, turning on the internal cooling primary circulation pump and the fan of the internal cooling air cooler; opening the third valve, and closing the fourth valve, and the fifth valve, wherein T2<T3 and the internal cooling air cooler operates at a predetermined percentage of power.

21. The method according to claim 20, further comprising:
when the ambient temperature measured by the temperature sensor is higher than the temperature T3 but not higher than a temperature T4, turning on the external cooling primary circulation pump, the internal cooling primary circulation pump; turning on the fan of the internal cooling air cooler and turning off the fan of the cold accumulation air cooler; opening the second valve, the fourth valve, the fifth valve, and closing the first valve and the third valve, wherein T3<T4 and the internal cooling air cooler operates at a predetermined percentage of power.

22. The method according to claim 21, further comprising:
when the ambient temperature measured by the temperature sensor is higher than the temperature T4 but not higher than a temperature T5, turning on the external cooling primary circulation pump, the internal cooling primary circulation pump; turning on the fan of the internal cooling air cooler and the fan of the cold accumulation air cooler; turning the second valve, the fourth valve, the fifth valve, and closing the first valve and the third valve, wherein T4<T5 and the internal cooling air cooler operates at a predetermined percentage of power.

23. The method according to claim 22, further comprising:
when the ambient temperature measured by the temperature sensor is higher than the temperature T5 but not higher than a temperature T6, turning off the external cooling primary circulation pump and turning off the fan of the cold accumulation air cooler, turning on the internal cooling primary circulation pump and the fan of the internal cooling air cooler; opening the third valve, and closing the fourth valve, and the fifth valve, wherein T5<T6 and the internal cooling air cooler operates at a predetermined percentage of power.

24. The method according to claim 23, further comprising:
when the ambient temperature measured by the temperature sensor is higher than the temperature T6, turning on the internal cooling primary circulation pump and the external cooling primary circulation pump; turning on the fan of the internal cooling air cooler and turns off the cold accumulation air cooler; opening the first valve, the fourth valve, the fifth valve, and closing the second valve and the third valve; wherein the internal cooling air cooler operates at a predetermined percentage of power.

25. The method according to claim 24, further comprising:
timing with a first timer beginning when the ambient temperature measured by the temperature sensor is higher than the temperature T6;
shutting off the first timer with the controller upon an M-hour time-out of the first timer; turning on the fan of the cold accumulation air cooler; opening the second valve, the third valve, and closing the first valve, the fourth valve, the fifth valve; and initiating the second timer to start timing;
shutting off the second timer upon an N-hour time-out of the second timer; and initiating the temperature sensor to start ambient temperature measurement again.

26. The method according to claim 25, wherein M and N range from 10 to 12 hours.

* * * * *

UNITED STATES PATENT AND TRADEMARK OFFICE
CERTIFICATE OF CORRECTION

PATENT NO. : 9,756,762 B2
APPLICATION NO. : 14/361834
DATED : September 5, 2017
INVENTOR(S) : Ding et al.

Page 1 of 1

It is certified that error appears in the above-identified patent and that said Letters Patent is hereby corrected as shown below:

On the Title Page

Item (87) PCT Pub. No.: Please correct "WO2013/078842" to read -- WO2013/078842 A1 --

Item (30) Foreign Application Priority Data: Please correct "2011 1 0391510" to read -- 2011 1 0391510.2 --

In the Specification

Column 2, Line 43: Please correct "stored M the cold" to read -- stored in the cold --

Signed and Sealed this
Thirteenth Day of February, 2018

Andrei Iancu
*Director of the United States Patent and Trademark Office*